(12) United States Patent
Ito et al.

(10) Patent No.: US 9,257,664 B2
(45) Date of Patent: Feb. 9, 2016

(54) ORGANIC ELECTROLUMINESCENT DISPLAY DEVICE

(71) Applicant: Japan Display Inc., Tokyo (JP)

(72) Inventors: Masato Ito, Tokyo (JP); Masakazu Gunji, Tokyo (JP); Masumi Nishimura, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/627,439

(22) Filed: Feb. 20, 2015

(65) Prior Publication Data

US 2015/0236291 A1  Aug. 20, 2015

(30) Foreign Application Priority Data

Feb. 20, 2014  (JP) ................................. 2014-030819

(51) Int. Cl.
| | | |
|---|---|---|
| *H01L 51/52* | (2006.01) | |
| *H01L 51/50* | (2006.01) | |
| *H01L 27/32* | (2006.01) | |
| *H01L 51/00* | (2006.01) | |

(52) U.S. Cl.
CPC ........ *H01L 51/5088* (2013.01); *H01L 27/3262* (2013.01); *H01L 51/0045* (2013.01); *H01L 51/504* (2013.01); *H01L 51/0008* (2013.01)

(58) Field of Classification Search
CPC ............................ H01L 51/5088; H01L 33/26
See application file for complete search history.

(56) References Cited

U.S. PATENT DOCUMENTS

| | | | | |
|---|---|---|---|---|
| 5,094,929 | A * | 3/1992 | Yagi et al. | 430/60 |
| 2004/0108810 | A1 * | 6/2004 | Tsujimura et al. | 313/506 |
| 2006/0289882 | A1 | 12/2006 | Nishimura | |
| 2008/0297036 | A1 * | 12/2008 | Noh et al. | 313/504 |

FOREIGN PATENT DOCUMENTS

| | | | | |
|---|---|---|---|---|
| JP | 63081446 | A | * | 4/1988 |
| JP | 2006-049396 | A | | 2/2006 |
| JP | 2009-301885 | A | | 12/2009 |

* cited by examiner

*Primary Examiner* — Allen Parker
(74) *Attorney, Agent, or Firm* — Lowe Hauptman & Ham, LLP

(57) ABSTRACT

An organic EL display device includes an organic EL element having a first light-emitting portion, a second light-emitting portion, an n-type charge-generation layer, and a p-type charge-generation layer. The first light-emitting portion has a first light-emitting layer and a hole-injection layer. The first light-emitting layer is formed between an anode and a cathode. The hole-injection layer is made of amorphous carbon and in contact with the anode. The second light-emitting portion has a second light-emitting layer, which is formed between the first light-emitting portion and the cathode. The n-type charge-generation layer is formed between the first and second light-emitting portions. The n-type charge-generation layer is in contact with the first light-emitting portion. The p-type charge-generation layer is made of amorphous carbon and formed between the n-type charge-generation layer and the second light-emitting portion. The p-type charge-generation layer is in contact with the second light-emitting portion.

4 Claims, 7 Drawing Sheets

FIG.6

|  | CHARGE GENERATION LAYER STRUCTURE | VOLTAGE(V) @10mA/cm² |
|---|---|---|
| EMBODIMENT (FIG.4) | EIL LAYER / a-C LAYER | 7.0 |
| MODIFICATION (FIG.5) | EIL LAYER / Ag LAYER / a-C LAYER | 6.9 |
| COMPARATIVE EXAMPLE | EIL LAYER / HAT LAYER | 7.8 |

ORGANIC ELECTROLUMINESCENT DISPLAY DEVICE

CROSS-REFERENCE TO RELATED APPLICATION

The present application claims priority from Japanese application JP2014-030819 filed on Feb. 20, 2014, the content of which is hereby incorporated by reference into this application.

BACKGROUND OF THE INVENTION

1. Field of the Invention

The present invention relates to an organic electroluminescent display device.

2. Description of the Related Art

In recent years, image display devices including a self-luminous element called an organic light-emitting diode (OLED), hereinafter simply "organic electroluminescent (EL) display devices", have been in practical use. Such an organic EL display device with a self-luminous element is excellent in visibility and response speed compared with liquid crystal display devices known in the art. Additionally, the organic EL display device eliminates the need for an auxiliary lighting device, such as a backlight, and thus can be made thinner.

There are two major types of color display methods in such organic EL display devices. In one method, each pixel has red (R), green (G), and blue (B) light-emitting elements that emit light of three colors: R, G, and B, respectively. In the other method, each pixel has a white light-emitting element and R, G, and B color filters, which respectively allow passage of light in the wavelength ranges corresponding to the three colors R, G, and B. There are also two types of light-emitting elements. One of them has only a single light-emitting layer. The other, called a tandem light-emitting element, has a stack of light-emitting layers and a charge generation layer (CGL) between them to activate each of the light-emitting layers to emit light.

JP 2006-049396 A discloses that an electron pull-out layer (A) is disposed between an anode electrode and a hole transport layer (B) and that the energy level difference between the highest occupied molecular orbital of the hole transport layer, HOMO (B), and the lowest unoccupied molecular orbital (LUMO) of the electron pull-out layer, LUMO (A), is expressed as 0<LUMO (A)−HOMO (B)<1.5 eV. JP 2009-301885 A discloses a multi-unit organic EL element having light-emitting layers and conductive intermediate layers laminated alternately, in which the conductive intermediate layers include at least a transparent conductive carbon layer.

When used in each pixel of the above organic EL display device, an organic EL element driven at a high voltage increases the power consumption of the organic EL display device. Moreover, such an organic EL element accelerates its deterioration to shorten the useful life of the organic EL display device.

SUMMARY OF THE INVENTION

The present invention has been made in view of the above circumstances. It is an object of the invention to provide an organic EL display device including an organic EL element that can be driven at a lower voltage.

An organic EL display device according to an aspect of the present invention includes an organic EL element having an anode electrode made of a conductive material, a cathode electrode made of a conductive material, a first light-emitting portion, a second light-emitting portion, an n-type charge generation layer, and a p-type charge generation layer. The first light-emitting portion has a first light-emitting layer and a hole injection layer. The first light-emitting layer is formed between the anode electrode and the cathode electrode to emit light in response to a potential difference applied between the anode electrode and the cathode electrode. The hole injection layer is made of amorphous carbon and in contact with the anode electrode. The second light-emitting portion has a second light-emitting layer. The second light-emitting layer is formed between the first light-emitting portion and the cathode electrode to emit light in response to the potential difference applied between the anode electrode and the cathode electrode. The n-type charge generation layer is formed between the first light-emitting portion and second light-emitting portion. The n-type charge generation layer is in contact with the first light-emitting portion to supply electrons to the first light-emitting portion. The p-type charge generation layer is made of amorphous carbon and formed between the n-type charge generation layer and the second light-emitting portion. The p-type charge generation layer is in contact with the second light-emitting portion to supply holes to the second light-emitting portion.

The organic EL display device according to the aspect may further include a metal layer, made of metal, between the n-type charge generation layer and the p-type charge generation layer.

In the organic EL display device according to the aspect, the metal layer may be made of any material selected from Ag alloy, Al alloy, Ag, or Al. The amorphous carbon may be formed as a layer by sputtering in an atmosphere including argon gas.

BRIEF DESCRIPTION OF THE DRAWINGS

FIG. 6 is a table comparing measured drive voltages between three different cases: when a charge generation layer has the stack structure in the embodiment shown in FIG. 4, when the layer has the stack structure in the modification shown in FIG. 5, and when the layer has a conventional stack structure.

DETAILED DESCRIPTION OF THE INVENTION

Embodiments of the present invention will now be described with reference to the accompanying drawings. The disclosure herein is merely an example, and any modification coming within the spirit of the present invention and obvious to those skilled in the art is intended to be included within the scope of the invention as a matter of course. The accompanying drawings schematically illustrate widths, thicknesses, shapes, or other characteristics of each part for clarity of illustration, compared to actual configurations. However, such a schematic illustration is merely an example and not intended to limit the present invention. In the present specification and drawings, some elements identical or similar to those shown previously are denoted by the same reference signs as the previously shown elements, and thus repetitive detailed descriptions of them may be omitted as appropriate.

Figure 1:
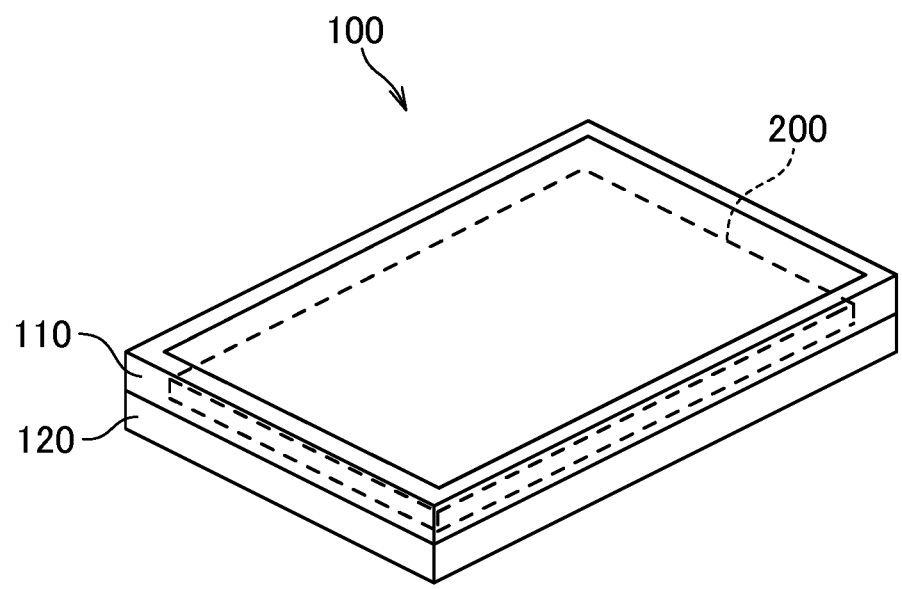
FIG. 1 is a diagram schematically showing an organic EL display device according to an embodiment of the present invention.

FIG. 1 schematically shows an organic EL display device 100 according to an embodiment of the present invention. As shown in the figure, the organic EL display device 100 includes an upper frame 110, a lower frame 120, and an organic EL panel 200 fixed between the upper frame 110 and the lower frame 120.

Figure 2:
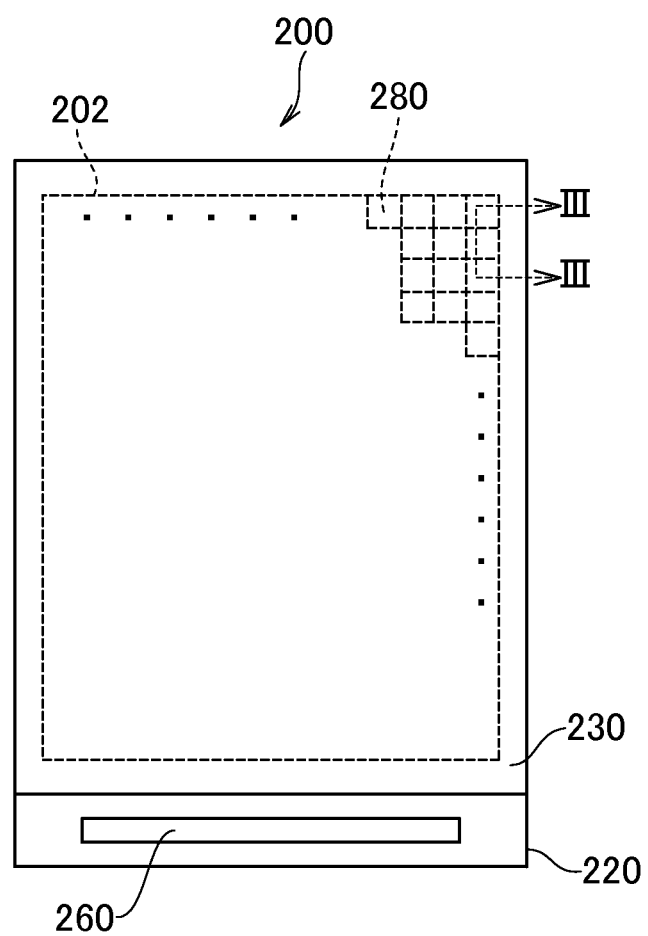
FIG. 2 is a diagram showing a configuration of an organic EL panel seen in FIG. 1.

FIG. 2 shows a configuration of the organic EL panel 200 seen in FIG. 1. The organic EL panel 200 has a TFT substrate 220, a counter substrate 230, and a transparent resin (not shown) filled between these two substrates. The organic EL panel 200 has sub-pixels 280 arranged in a matrix in a display area 202. For example, a combination of three or four sub-pixels 280, which emit light in different wavelength ranges, constitute a single pixel. Each sub-pixel 280 of the TFT substrate 220 includes a switching transistor, a capacitor, and a driver transistor. The switching transistor has a gate coupled to a scan line and controls input from a data line. The capacitor holds data input from the switching transistor. The driver transistor supplies current to an organic light-emitting diode in accordance with the input data. TFT substrate 220 has a driver integrated circuit (IC) 260 mounted on it. The driver IC 260 is a driver circuit that applies a voltage corresponding to a grayscale value of each sub-pixel 280 to the corresponding data line.

Figure 3:
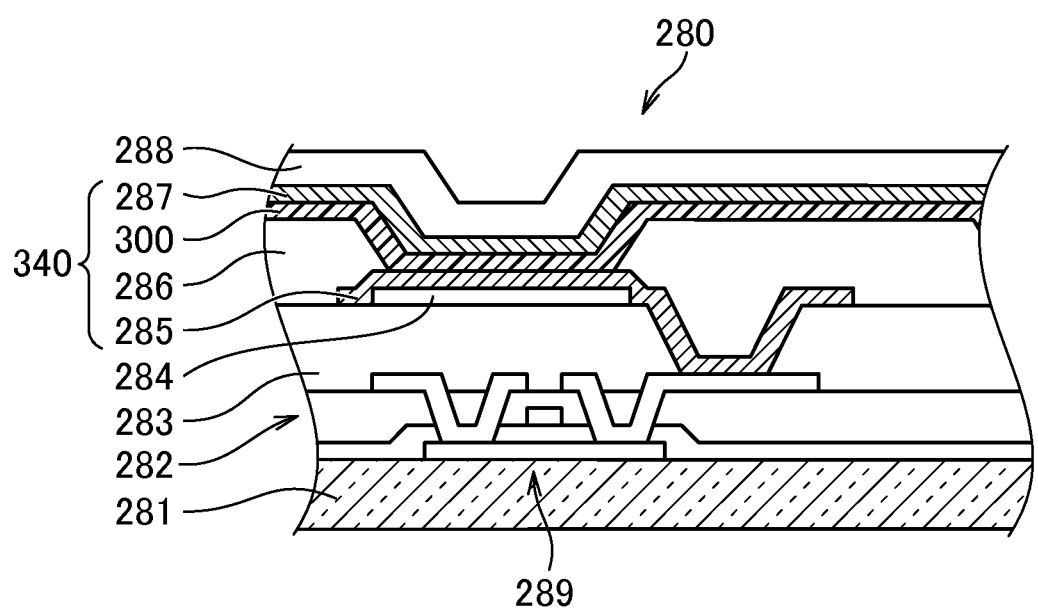
FIG. 3 is a diagram schematically showing a cross section of a sub-pixel in a thin film transistor (TFT) substrate taken along line III-III in FIG. 2.

FIG. 3 is a diagram schematically showing a cross section of a sub-pixel 280 of the TFT substrate 220 taken along line III-III in FIG. 2. As shown in the diagram, the sub-pixel 280 of the TFT substrate 220 has a glass substrate 281, a TFT circuit layer 282, a planarization film 283, an anode electrode 285 made of a conductive material, an insulating bank 286, an organic layer 300, a reflective layer 284, a cathode electrode 287 made of a conductive material, and a sealing film 288. The glass substrate 281 is an insulating substrate. The TFT circuit layer 282, formed on the glass substrate 281, includes a circuit having, for example, a pixel transistor 289. The planarization film 283, made of an insulating material, is formed on the TFT circuit layer 282. The anode electrode 285 is coupled to the circuit of the TFT circuit layer 282 through a through-hole in the planarization film 283. The insulating bank 286 covers the edge of the anode electrode 285 to insulate this anode electrode 285 from the different anode electrodes 285 in the adjacent sub-pixels 280. The organic layer 300 is formed on the anode electrode 285 and the insulating bank 286 so as to entirely cover the display area 202. The reflective layer 284 reflects light emitted by a light-emitting layer in the organic layer 300. The cathode electrode 287 is formed on the organic layer 300 so as to entirely cover the display area 202. The sealing film 288 keeps out air and water to prevent the deterioration of the organic layer 300. The pixel transistor 289 controls the brightness of the light emitted by the light-emitting layer in the organic layer 300 in each sub-pixel 280. In this embodiment, the structure from the anode electrode 285 to the cathode electrode 287 is referred to as an organic EL element 340. FIG. 3 shows an example cross-section of the TFT substrate 220 used in a top-emitting organic EL display device. Alternatively, the TFT substrate 220 may be modified to adapt to a bottom-emitting organic EL display device, or modified to have another cross section. The transistors in the TFT circuit layer 282 may be made of amorphous silicon, low-temperature polysilicon, or other semiconductor materials.

Figure 4:
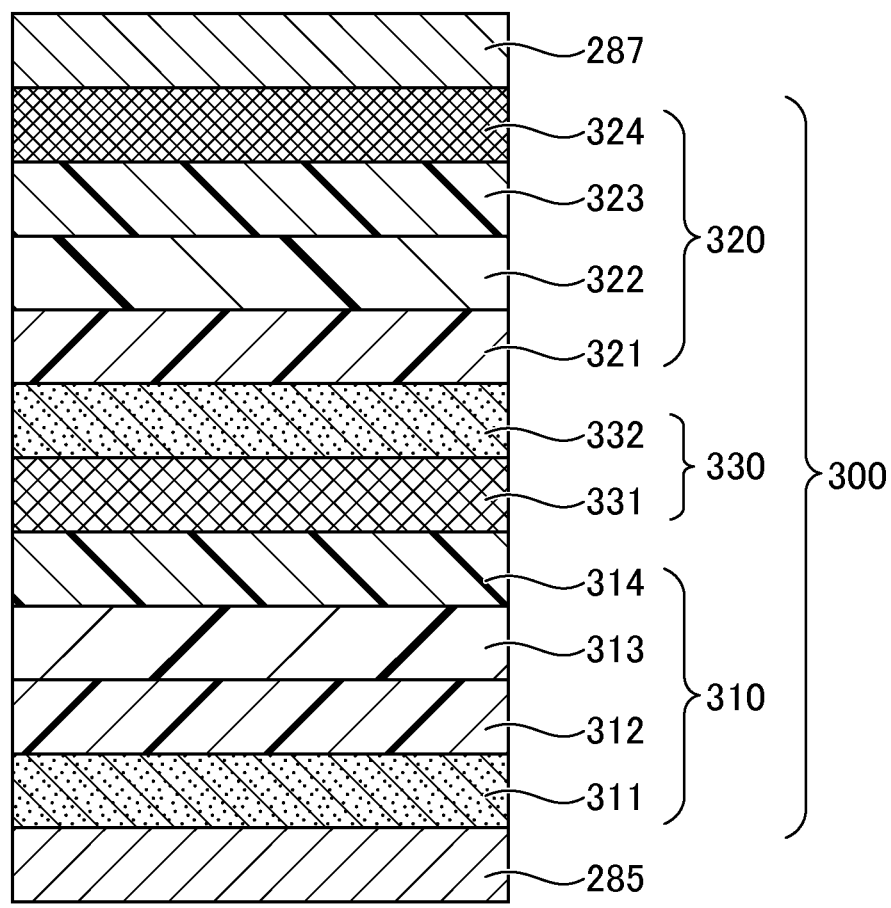
FIG. 4 is a diagram schematically showing a stack structure of an organic layer.

FIG. 4 is a diagram schematically showing a stack structure of the organic layer 300 of the organic EL element 340. As shown in the diagram, the organic layer 300, formed between the anode electrode 285 and the cathode electrode 287, has what is called a tandem structure. Specifically, the organic layer 300 has two separate light-emitting portions, which are a first light-emitting portion 310 and a second light-emitting portion 320, and a charge generation layer (CGL) 330 between these two light-emitting portions. The organic layer 300 has two light-emitting portions in this embodiment, whereas it may have three or more light-emitting portions.

As shown in FIG. 4, the first light-emitting portion 310 includes a hole injection layer (HIL) 311, a first hole transport layer (HTL) 312, a first light-emitting layer 313, and a first electron transport layer (ETL) 314, which are stacked in this order from the anode electrode 285. The hole injection layer 311 is made of amorphous carbon, which can be formed as a layer by sputtering in an atmosphere including argon gas. The first hole transport layer 312 is made of, for example, 4,4-bis[N-(1-naphthyl)-N-phenyl-amino]biphenyl (NPD). The first light-emitting layer 313 is made of an organic light-emitting material. The first electron transport layer 314 is made of a material, such as Tris(8-hydroxyquinolinato)aluminum (Alq3). The second light-emitting portion 320 includes a second hole transport layer 321, a second light-emitting layer 322, a second electron transport layer 323, and an electron injection layer (EIL) 324, which are stacked in this order from the anode electrode 285. The second hole transport layer 321 is made of, for example, NPD. The second light-emitting layer 322 is made of an organic light-emitting material. The second electron transport layer 323 is made of a material, such as Alq3. The electron injection layer 324 is made of, for example, an alkali metal, such as Li, and an organic material. The charge generation layer 330 includes an n-type charge generation layer 331 and a p-type charge generation layer 332. The n-type charge generation layer 331 is made of, for example, an alkali metal, such as Li, and an organic material. The n-type charge generation layer 331 supplies electrons to the first light-emitting portion 310. The p-type charge generation layer 332, made of amorphous carbon, supplies holes to the second light-emitting portion 320.

The first light-emitting layer 313 and the second light-emitting layer 322 may each emit light in any wavelength range. For example, a combination of a blue (B) light-emitting layer and a yellow (Y) light-emitting layer, or a combination of a B light-emitting layer and a red (R) and green (G) light-emitting layer can produce white light. The hole injection layer 311 and the p-type charge generation layer 332 are made of amorphous carbon in this embodiment, although they have been made of an organic material. The use of amorphous carbon can improve hole-injecting properties of the hole injection layer 311, thus lowering the voltage for light emission. Additionally, this can reduce hole injection problems to improve manufacturing yield. The use of amorphous carbon can also improve hole-injecting properties of the p-type charge generation layer 332, thus resulting in a better carrier balance between holes and electrons as well as a lower voltage. Consequently, this can extend the life of the organic EL element 340.

Figure 5:
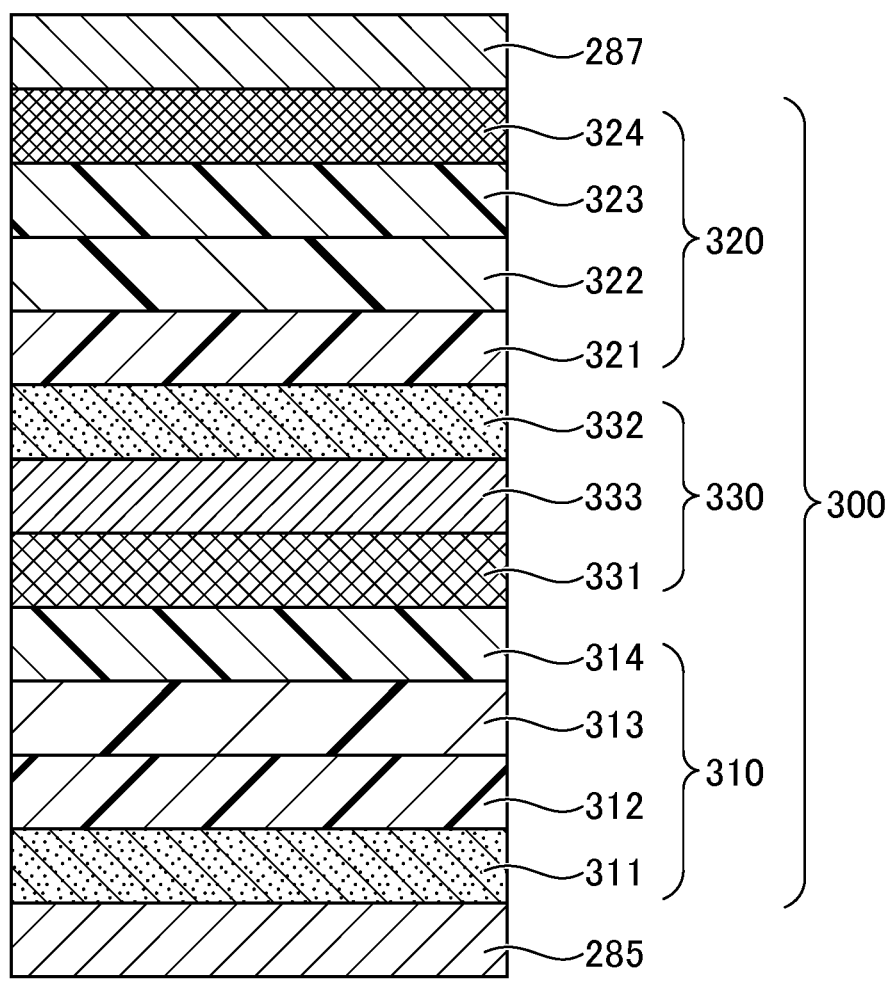
FIG. 5 is a diagram showing a modification of the stack structure seen in FIG. 4.

FIG. 5 is a diagram showing a modification of the stack structure seen in FIG. 4. This modification differs from the structure shown in FIG. 4 in that a metal layer 333 made of metal, for example, an alloy of Ag and Mg, an Al alloy, a single-element Ag, or a single-element Al, is disposed between the n-type charge generation layer 331 and the p-type charge generation layer 332, whereas the other portions are the same. In addition to the same effect as the structure shown in FIG. 4, the metal layer 333, disposed between the n-type charge generation layer 331 and the p-type charge generation layer 332, enables light emitted by the light-emitting portion near the reflective layer 284 to constructively interfere to form more intense light, thus increasing the light-emitting efficiency. When the amorphous carbon in the p-type charge generation layer 332 is formed, for example, by sputtering, the metal layer 333 reduces the risk of damage to the n-type charge generation layer 331, thus preventing an increase in drive voltage due to the damage. Consequently, the metal layer 333 can further lower the voltage and extend the life of the organic EL element 340.

FIG. 6 is a table comparing measured drive voltages between three different cases: when the charge generation layer 330 has the stack structure in the embodiment shown in FIG. 4, when the layer has the stack structure in the modification shown in FIG. 5, and when the layer has a conventional stack structure. Each of the stack structures has, as the n-type charge generation layer 331, a layer formed by codeposition of an organic material and Li (EIL layer), which is the same composition as the electron injection layer 324. The stack structure in the embodiment shown in FIG. 4 has an amorphous carbon layer (a-C layer) as the p-type charge generation layer 332. The stack structure in the modification shown in FIG. 5 has a Ag layer, made of Ag, as the metal layer 333 between the n-type charge generation layer 331 and the p-type charge generation layer 332. On the other hand, the comparative example has no metal layer 333 and uses what is called HAT-CN for the p-type charge generation layer 332. As can be seen from the values in this table, the comparative example needs a drive voltage of 7.8 V to pass a current of 10 mA/cm2. By contrast, the stack structure in the embodiment shown in FIG. 4 and the stack structure in the modification shown in FIG. 5 can lower the drive voltages to 7.0 V and 6.9 V, respectively. It should also be noted that the stack structure in the modification shown in FIG. 5 could achieve the drive voltage 0.1 V lower than that of the stack structure in the embodiment shown in FIG. 4. Thus, the stack structures in the embodiment and the modification can drive the organic EL element 340 of the organic EL display device 100 at a lower voltage.

Figure 7:
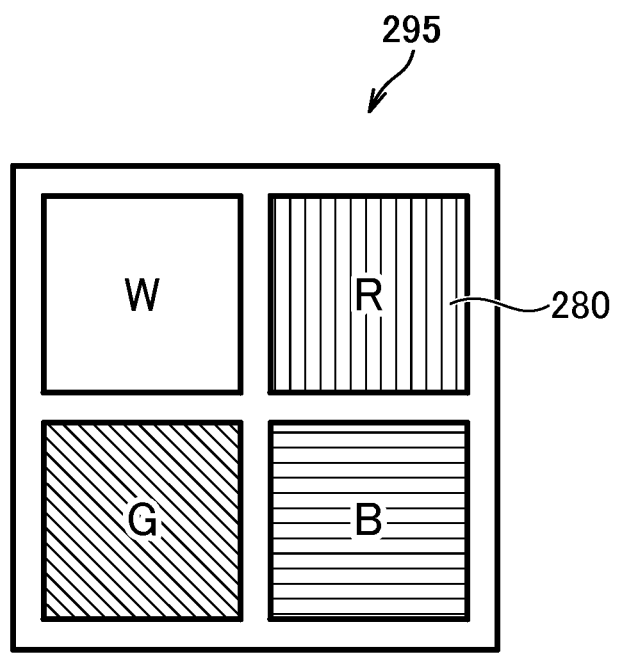
FIG. 7 is a diagram illustrating a pixel arrangement of the organic EL display device having the above stack structure.

FIG. 7 is a diagram illustrating a pixel arrangement of the organic EL display device 100 having the above stack structure. The pixel 295 in this example has sub-pixels 280 of four colors: red (R), green (G), blue (B), and white (W). Each sub-pixel 280 has four sides, two of which each face the corresponding side of adjacent sub-pixel 280 in the pixel 295. This arrangement enables the organic EL element 340 in the TFT substrate 220 to emit white light. To produce white light, the first light-emitting layer 313 and the second light-emitting layer 322 may be, for example, a combination of a blue (B) light-emitting layer and a yellow (Y) light-emitting layer, or a combination of a B light-emitting layer and a red (R) and green (G) light-emitting layer. When the organic EL element 340 is configured to emit white light, color filters corresponding to RGBW may be disposed on the areas corresponding to the sub-pixels 280 of the counter substrate 230. In this case, transparent color filters or no color filters may be disposed for the sub-pixels 280 corresponding to W. However, the pixel arrangement is not limited to this. For example, the pixel may consist of three sub-pixels, or include sub-pixels of another combination of colors. Alternatively, the pixel may include same-colored sub-pixels arranged longitudinally or laterally, or sub-pixels arranged differently.

While there have been described what are at present considered to be certain embodiments of the invention, it will be understood that various modifications may be made thereto, and it is intended that the appended claims coverall such modifications as fall within the true spirit and scope of the invention.

What is claimed is:

1. An organic EL display device including an organic EL element, the organic EL element comprising:
    an anode electrode made of a conductive material;
    a cathode electrode made of a conductive material;
    a first light-emitting portion having a first light-emitting layer and a hole injection layer, the first light-emitting layer being formed between the anode electrode and the cathode electrode to emit light in response to a potential difference applied between the anode electrode and the cathode electrode, the hole injection layer being made of amorphous carbon and in contact with the anode electrode;
    a second light-emitting portion having a second light-emitting layer, the second light-emitting layer being formed between the first light-emitting portion and the cathode electrode to emit light in response to the potential difference applied between the anode electrode and the cathode electrode;
    an n-type charge generation layer formed between the first light-emitting portion and second light-emitting portion, the n-type charge generation layer being in contact with the first light-emitting portion to supply electrons to the first light-emitting portion; and
    a p-type charge generation layer made of amorphous carbon and formed between the n-type charge generation layer and the second light-emitting portion, the p-type charge generation layer being in contact with the second light-emitting portion to supply holes to the second light-emitting portion.

2. The organic EL display device according to claim 1, further comprising
    a metal layer, made of metal, between the n-type charge generation layer and the p-type charge generation layer.

3. The organic EL display device according to claim 2, wherein
    the metal layer is made of a material selected from the group consisting of Ag alloy, Al alloy, Ag, and Al.

4. The organic EL display device according to claim 1, wherein
    the amorphous carbon is formed as a layer by sputtering in an atmosphere including argon gas.

* * * * *